(12) United States Patent
Zywno et al.

(10) Patent No.: US 7,633,070 B2
(45) Date of Patent: Dec. 15, 2009

(54) SUBSTRATE PROCESSING APPARATUS AND METHOD

(75) Inventors: Marek Zywno, San Jose, CA (US); Noah Bareket, Saratoga, CA (US)

(73) Assignee: KLA-Tencor Technologies Corporation, Milpitas, CA (US)

( * ) Notice: Subject to any disclaimer, the term of this patent is extended or adjusted under 35 U.S.C. 154(b) by 341 days.

(21) Appl. No.: 11/670,896

(22) Filed: Feb. 2, 2007

(65) Prior Publication Data
US 2008/0142733 A1  Jun. 19, 2008

Related U.S. Application Data

(60) Provisional application No. 60/870,528, filed on Dec. 18, 2006.

(51) Int. Cl.
*G03B 27/62* (2006.01)
(52) U.S. Cl. .................. 250/442.11; 355/73; 355/75
(58) Field of Classification Search ............ 250/442.11; 310/12; 355/73, 75
See application file for complete search history.

(56) References Cited

U.S. PATENT DOCUMENTS

| | | | |
|---|---|---|---|
| 5,641,960 A | 6/1997 | Okubo et al. | |
| 6,304,320 B1 * | 10/2001 | Tanaka et al. | 355/73 |
| 6,515,742 B1 | 2/2003 | Ruprecht | |
| 6,552,773 B2 | 4/2003 | Emoto | 355/53 |
| 7,288,859 B2 * | 10/2007 | Hazelton | 310/12 |
| 2002/0047542 A1 | 4/2002 | Higuchi | |
| 2003/0230323 A1 | 12/2003 | You et al. | |
| 2005/0092013 A1 | 5/2005 | Emoto | 62/304 |
| 2006/0054494 A1 | 3/2006 | Reiss | |

FOREIGN PATENT DOCUMENTS

| | | |
|---|---|---|
| WO | WO 9715978 | 5/1997 |
| WO | WO 2005/078526 | 8/2005 |
| WO | WO 2006007167 | 1/2006 |

OTHER PUBLICATIONS

International Search Report and Written Opinion of the International Searching Authority dated Sep. 23, 2008—International Patent Application No. PCT/US07/87953.
U.S. Appl. No. 60/948,667, to Marek Zywno et al., entitled "Substrate Processing Apparatus and Method" filed Jul. 9, 2007.
U.S. Appl. No. 12/170,361, to Marek Zywno et al., entitled "Substrate Processing Apparatus and Method" filed Jul. 9, 2008.
U.S. Appl. No. 12/335,736, to Marek Zywno et al., entitled "Dynamic Tracking of Wafer Motion and Distortion During Lithography", filed Dec. 16, 2008.
U.S. Appl. No. 60/870,528, to Marek Zywno et al., entitled "Substrate Processing Apparatus and Method" filed Dec. 18, 2006.
U.S. Appl. No. 11/532,748 to Yehiel Gotkis et al., entitled "Temperature Stabilization for Substrate Processing" filed Sep. 18, 2006.

* cited by examiner

*Primary Examiner*—Kiet T Nguyen
(74) *Attorney, Agent, or Firm*—Joshua D. Isenberg; JDI Patent

(57) ABSTRACT

A substrate processing apparatus and method are disclosed.

50 Claims, 10 Drawing Sheets

SUBSTRATE PROCESSING APPARATUS AND METHOD

CROSS-REFERENCE TO A RELATED APPLICATION

This application claims priority from co-pending provisional patent application Ser. No. 60/870,528, which was filed on Dec. 18, 2006, the entire disclosures of which are incorporated herein by reference.

GOVERNMENT INTERESTS

This invention was made with Government support under Agreement HR0011-06-3-0008 awarded by the Defense Advanced Research Projects Agency (DARPA). The Government has certain rights in the invention.

FIELD OF THE INVENTION

This invention generally relates to substrate inspection and lithography and more particularly to movable stages used in substrate inspection and lithography.

BACKGROUND OF THE INVENTION

Historically wafer writing in lithography and scanning in metrology and inspection systems have used linear stepping or scanning motion to translate a substrate. Rectilinear motion has the advantages of simplicity in the rendering process, since the die on a semiconductor wafer are typically arranged in the direction of motion. In Cartesian (XY) reticle writing the data path follows the prevailing directionality in the geometry to be rendered. However, the factor limiting the throughput is the mechanical motion of the Cartesian stage. As the data path electronics get faster, this mechanical limitation of Cartesian systems becomes more limiting, and the data path rendering in polar coordinates becomes easier. The data path rendering speed is expected to continue to follow the Moore's law and improve with newer generations of semiconductors, while throughput of Cartesian stages is subject to relatively slow progress in precision engineering.

Reciprocating stages have a practical limit of turnaround time at the end of the swath of about 100 milliseconds. To shorten this time mechanics must allow higher bandwidths. The use of high performance materials allows only for moderate improvements of highest scanning speed. The increases in acceleration at the end of the motion also have their limitation in power of actuators, heat dissipation, reaction on the vibration isolation system and the machine base, settling after acceleration etc.

It is within this context that embodiments of the present invention arise.

BRIEF DESCRIPTION OF THE DRAWINGS

Objects and advantages of the invention will become apparent upon reading the following detailed description and upon reference to the accompanying drawings in which.

DESCRIPTION OF THE SPECIFIC EMBODIMENTS

Although the following detailed description contains many specific details for the purposes of illustration, anyone of ordinary skill in the art will appreciate that many variations and alterations to the following details are within the scope of the invention. Accordingly, the exemplary embodiments of the invention described below are set forth without any loss of generality to, and without imposing limitations upon, the claimed invention.

Figure 1:
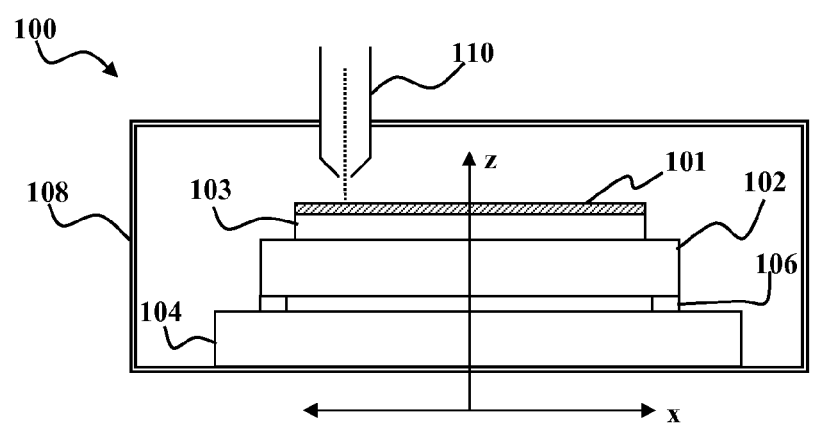
FIG. 1 is a schematic diagram of substrate processing apparatus utilizing a rotary-translating stage according to an embodiment of the present invention.

An example of a substrate processing apparatus 100 according to an embodiment of the present invention is depicted schematically in FIG. 1. The apparatus 100 generally includes a first stage 102 and a second stage 104. The first stage 102 carries one or more substrate chucks 103. Each substrate chuck 103 is adapted to support and retain a substrate 101. Examples of suitable substrates include, but are not limited to, semiconductor wafers, or reticles for optical lithography. The first stage 102 moves with respect to the second stage 104. By way of example, the first stage 102 may be a rotary stage 102 that rotates about a z axis. The second stage 104 may be a translating stage moves the rotary stage 103 linearly in a direction parallel to the plane of rotation of the rotary stage 102. One or more bearings support the rotary stage 102, facilitate smooth rotation of the rotary stage 102 and transfer translation forces between the rotary stage 102 and the translating stage 104 in such a way as to maintain the z axis of the rotating stage in a substantially fixed position and orientation relative to the translating stage 104 as the translating stage moves with respect to a support structure 108. By way of example, the support structure 108 may be a vacuum chamber, the lid of the vacuum chamber, or a stage base structure.

By way of example, the rotary stage 102 and translating stage 104 may be disposed within a chamber, e.g., a vacuum chamber, to provide a controlled environment for processing the substrate 101 and serves as the support structure 108. A substrate processing tool 110 may be used to probe selected portions of the substrate 101 with radiation, e.g., in the form of electromagnetic radiation, such as infrared, visible or ultraviolet light, or in the form of a beam of charged particles, such as electrons or ions. The processing tool, 110, may be part of a lithographic system, e.g. an electron beam exposure column or an optical lithography lens system. Alternatively, the tool 110 may be part of a substrate metrology or inspection tool that exposes selected portions of the substrate 101 to radiation and collects scattered or secondary radiation from the substrate 101. Examples of such tools include optical wafer inspection tools and scanning electron microscopes.

The combined rotary motion of the rotary stage 102 and linear motion of the translating stage 104 move the substrate 101 relative to the tool 110 in such a way that the optical column may probe the entire surface of the substrate 101 in a continuous fashion e.g., along a spiral path. Such motion is analogous to the movement of a phonograph needle relative to a record or a laser beam relative to a compact disc (CD). The principal difference being that in embodiments of the present invention, the tool 110 remains substantially fixed with respect to the chamber and the substrate 101 rotates and is moved linearly relative to the fixed tool 110. By "substantially fixed" it is meant that the there may be some mechanism for adjustment of small scale variations in positioning. Preferably, such position variations are within an ability of a sensor to detect and within an ability of the adjustment mechanism to counteract while maintaining a desired resolution in relative positioning between the tool 110 (or a beam from the tool) and the substrate 101. Mechanisms for such adjustment are described in detail below.

Unlike reciprocating motion or R-θ motion of conventional non-continuous R-θ positioning stages, continuous rotary motion, is inherently smooth. The inertial forces of the rotary stage 102 are inherently balanced, and gyroscopic effects tend to stabilize the orientation of the rotation axis z. Consequently, an apparatus of the type shown in FIG. 1 may scan large substrates quickly without having to impart high acceleration to the substrate 101. In alternative embodiments the tool may probe the surface of the substrate 101 with continuous rotary motion along a series of concentric circular paths having different radii. In such a case, the rotary motion may be kept continuous while the linear motion is discontinuous.

In multiple substrate configurations, multiple chucks may be arranged symmetrically on a rotating platter. The layout of the chucks 103 on the rotary stage 102 can be in a single radial arrangement, with all chucks 103 arranged at the same radial distance from the z axis. Alternatively, the chucks 103 may be arranged in multiple rows, a hexagonal pack, or another arrangement suitable for writing or probing of the substrates. Corresponding data path strategies would follow the substrate layout.

One or more of the chucks 103 may be equipped with sensors allowing for feedback of parameters important to accurate writing, for example thermal sensors, e-beam detectors, e-beam reflectors or position sensors.

Several configurations are possible for the bearings 106, to meet the requirements of a very high throughput stage. For example, the rotary-translation stage may be implemented using magnetic levitation (maglev) in the bearings 106 to support the rotary stage 102. Alternatively, the Rotary-Translation stage may use air bearings or conventional bearings as an alternative to magnetic levitation. In some embodiments a fixed rotary stage may be combined with one or more moving tools. For example a differentially pumped air bearing rotary stage may be combined with a differentially pumped air bearing tool slide. Alternatively, a conventional bearing rotary stage may be combined with a sliding seal moving tool.

It is noted that the placement of maglev bearings 106 proximate a periphery of the rotary stage 102 keeps stray magnetic fields from the bearings 106 at a safe distance from the tool 110. This greatly reduces the effect of such magnetic fields on the operation of the tool, particularly when the tool 110 is a charged particle beam column, such as an electron beam column. It is further noted that this same concept may also apply to an X-Y translation stage, e.g., in which the first stage 102 moves linearly along an x axis that is fixed with respect to the second stage and the second stage 104 moves linearly along a y axis that is at an angle relative to the x axis.

In a preferred embodiment of a rotary-linear stage 200 shown in FIGS. 2A-2E, a rotary stage 202 is carried by a linear stage 204 using linear motors 205. The rotary stage 202 supports multiple substrate chucks 203. The rotary stage 202 includes a peripheral ferromagnetic ring 206. Peripherally mounted rotary stage radial maglev units 207X, 207Y attached to the intermediate linear stage 204 apply magnetic forces to the ring 206 along the x and y axes, respectively along lines of force that intersect the rotation axis z. Peripherally mounted rotary stage vertical maglev units 207X, 207Y attached to the intermediate linear stage 204 apply magnetic forces to the ring 206 along the rotation axis z.

The linear stage 204 may suspended by electromagnet levitation units (Z maglevs) 209 from a support structure. By way of example, the support structure may be the underside of a lid of a vacuum chamber 208. The chamber lid may also carry a substrate processing tool 210. By way of example and without limitation, the tool 210 may include e.g., an e-beam column or multiple columns. To reduce the force path for reaction forces, the rotary stage vertical maglevs 207Z and the X-stage vertical maglevs 209 may be arranged in close proximity, e.g., in a side-by-side or a back-to-back configuration such that the maglevs 207Z, 209 apply forces along a common line of action.

The linear stage may be translated by one or more parallel linear motors 205. In a preferred configuration two linear motors 205 are used, symmetrically placed in respect to the center of moving linear mass. For example, to guide the linear motion of the linear stage 204, the linear motors 205 may include a set of lateral electromagnets 212 of alternating polarity that guide the linear stage 204 along parallel ferromagnetic guideways 214. X-stage Y-maglevs 216 may be used to finely adjust the position of the x-stage 204 along the Y-direction relative to the guideways 216. Preferably, the rotary stage 202 is suspended with respect to the X-stage 204 by at least 3, more preferably 4 rotary stage radial maglevs 207X, 207Y. These radial maglevs are preferably arranged in close proximity to corresponding Y-maglevs 216 that adjust the position of the linear stage 204 in the y direction. To shorten the path for reaction forces, the X-stage Y-maglevs 216 may be arranged back-to-back with the rotary stage radial maglevs 207Y. Most preferably, 4 rotary stage radial maglevs 207X, 207Y may be assembled back to back with corresponding linear stage Y-maglevs 216 electromagnets. This way any forces controlling the imbalance of the rotary stage 202 are transmitted directly to the stationary chamber lid 208, and do not excite structural vibration modes of the linear stage 204.

The magnetic flux from the maglevs 207X, 207Y, 207Z, 209 and 216 may be confined and shielded to prevent it from interfering with the tool 210. In addition the peripheral placement of the maglevs 207X, 207Y, 207Z, 209 and 216 and ferromagnetic ring 206 keep them and their flux far from the tool 210 so that these fluxes do not interfere with magnetic lens fields from the tool 210 that are used, e.g., to focus an electron beam. The rotary stage 202 may be made of a magnetically transparent material, e.g., a ceramic, aluminum, etc. to further reduce undesirable effects on the tool 210. In addition, the rotary stage 202 may be made of a material having a high electrical resistivity reduce eddy currents that might affect the electron beam from an electron beam optical column, if one is included in the tool 210. It is desirable for the electrical resistivity to be high enough to make eddy currents insignificant, while still allowing dissipation of electrical charge from the surface. By way of example, and without limitation, the electrical resistivity may range from about 1 ohm-cm to about 1000 ohm-cm. Examples of suitable high-resistivity materials include, but are not limited to silicon carbide, tungsten carbide. In addition insulating ceramics having electrical resistivities larger than about 1000 ohm-cm, with surface treatment for dissipating electric charge build-up may be used.

Figure 2A:
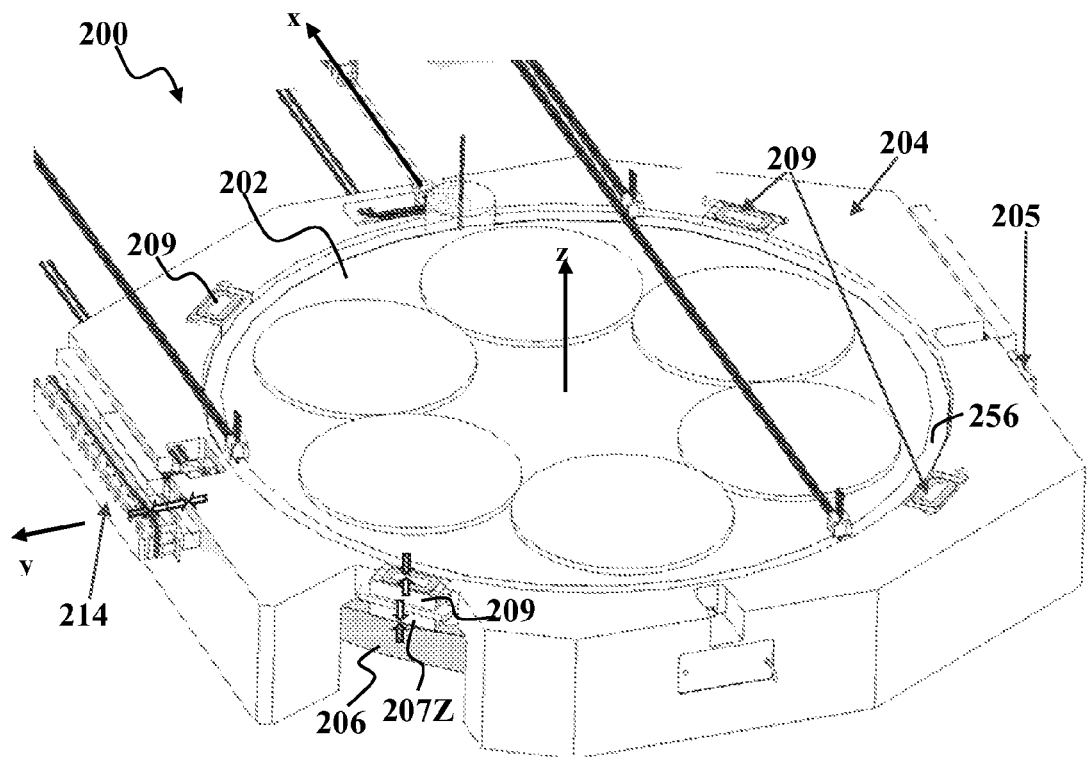
FIG. 2A is a three-dimensional schematic diagram of a rotary-translating stage according to a preferred embodiment of the present invention.
Figure 2B:
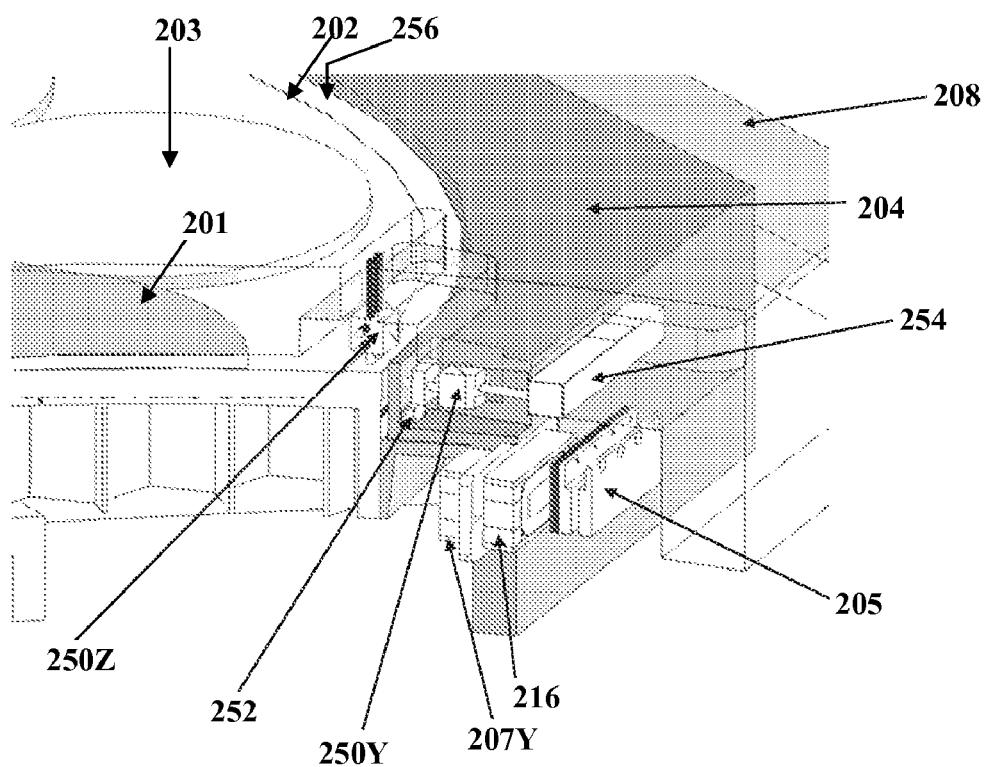
FIG. 2B is a close-up cutaway view of a portion of the rotary-translating stage of FIG. 2A.
Figure 2C:
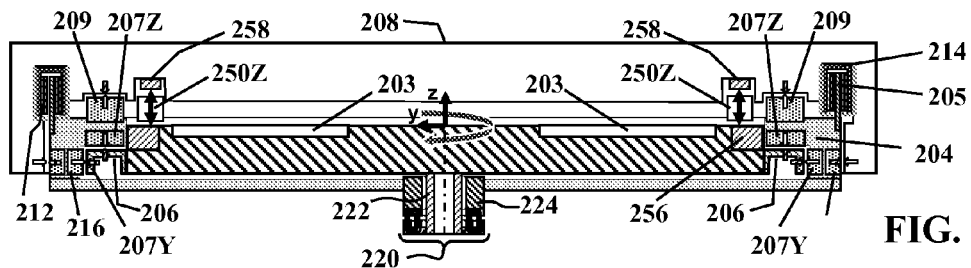
FIG. 2C is a side cross-sectional view of the substrate processing apparatus of FIG. 2F employing the rotary-translating stage taken along line A-A.
Figure 2D:
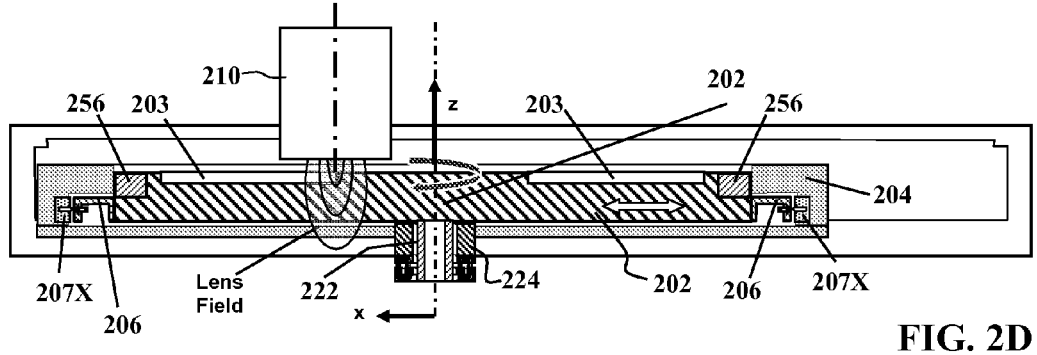
FIG. 2D is a side cross-sectional view of the substrate processing apparatus of FIG. 2F employing the rotary-translating stage taken along line B-B.

As shown in FIGS. 2C-2D, the rotary stage 202 may be spun by a central rotary motor 220 having a rotor 222 and a stator 224. The rotor 222 is attached to the center of the rotary stage 202 and the stator 224 is attached to the linear stage 204. In FIGS. 2C-2D the rotor 222 is depicted as being inside the stator 224. It is also possible to configure the motor 220 so the stator 224 is in the center, attached to the linear stage 204, and the rotor 222 is on the outside, attached to the rotary stage 202. The stator 224 may exert magnetic forces on the rotor 222 along the z direction that partly counteract the weight of the rotary stage 202 or other z-directed forces acting on the rotary stage 202.

In certain embodiments it may be desirable to support all or nearly all of the weight of the rotary stage 202 using the rotor 222 and stator 224. This may be particularly useful where fine control of the rate of rotation of the rotary stage 202 is important in maintaining a high degree of resolution in the relative positioning of the substrates 201 and the tool 210. In particular, the magnetic fields used by the rotary stage vertical maglevs 207Z to levitate the rotary stage 202 may produce eddy currents in the ferromagnetic ring 206. Such eddy currents can produce a magnetic drag torque that can slow down the rotation of the rotary stage 202. Countering such drag forces with a torque from the motor 220 can produce an undesired torque ripple that leads to poor control of the rotation rate.

Figure 2E:
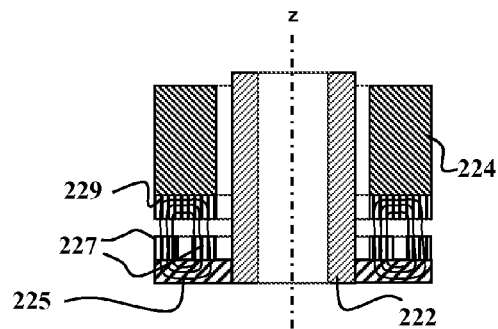
FIG. 2E is a side cross-sectional view showing a close-up of a rotor and stator configured to magnetically support the weight of a rotary stage in the substrate process apparatus of FIG.
Figure 2F:
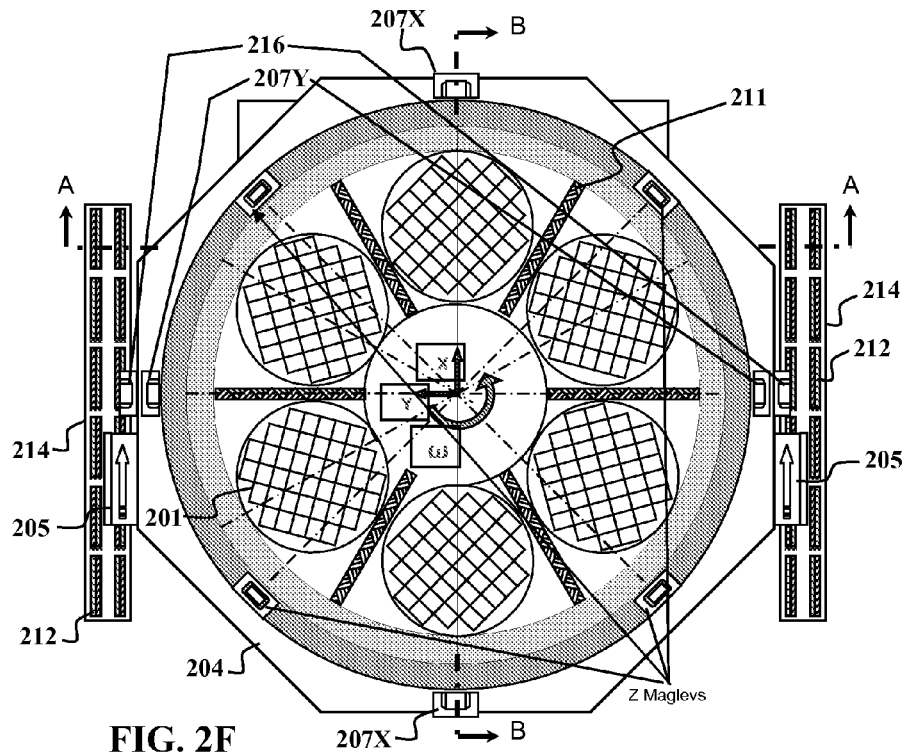
FIG. 2F is a top plan view schematic of a substrate processing apparatus that uses a rotary-translating stage according to an embodiment of the present invention showing one possible configuration for magnetic levitation and linear actuation.

To reduce such eddy currents, the rotor 222 and stator 224 may be configured to bear the weight of the rotary stage 202. This may be done using air bearings, mechanical bearings or magnetic levitation. FIG. 2E shows close-up detail of an example of a magnetic levitation scheme. In this example, a pole piece 225 and one or more permanent magnets 227 are attached to the rotor at a point below the bottom of the stator 224. A corresponding pole piece 229 is attached to the bottom of the stator 224. The stator pole piece 229 may be laminated to reduce eddy currents. Attractive magnetic forces between the permanent magnet 227 and stator pole piece 229 are transferred in a vertical direction to the rotary stage 202 by the rotor 222. In alternative embodiments, magnets may be attached to the stator 224 instead of the rotor 222 or to both the stator and rotor. Furthermore, the magnets and pole pieces on the rotor and stator may alternatively be configured to levitate the rotary stage 202 by magnetic repulsion.

With all or most of the weight of the rotary stage 202 supported by the forces between the rotor 222 and stator 224, and the rotary stage properly balanced, torque from the motor 220 may be primarily used to "spin up" the rotary stage 202 to a desired rotational speed. After that, the torque exerted by the motor 220 on the rotary stage 202 may be greatly reduced as the rotary stage spins under its own inertia. In addition, the rotary stage vertical maglevs 207Z can finely adjust the vertical position of the rotary stage 202 with relatively small magnetic forces, and therefore, much smaller eddy currents. This allows the use of a non-laminated ferromagnetic ring 206, which may simplify fabrication and reduce cost.

It is also possible to drive the rotary motion of the rotary stage 202 using a conductive ring, such as the outside ring ferromagnetic ring 206 of the rotary stage 202, and having the rotary motion stator 224 built into the linear stage 204, proximate the periphery of the ring 206. In one such configuration the resulting rotary motor may be an induction AC motor, using eddy currents induced in a conductive ring mounted at the periphery of the rotary stage 202. It is noted that this latter configuration keeps stray magnetic fields from the motor away from the beam column 210 even if the rotary stage 202 supports a single substrate chuck that is concentric with the z axis.

In the example shown in FIGS. 2A-2E, the rotary stage 202 has six chucks 203 for supporting substrates 201. Note that the placement of the chucks 203 shown in FIGS. 2A-2D and 2F keeps the substrates at a distance from stray magnetic fields from the motor 220. This particular example is for purposes of illustration, and is not to be considered a limitation on any embodiment of the invention. The rotary stage 202 is carried by a linear X stage 204. The rotary stage 202 and its coordinate system defined by axes $x_s$, $y_s$ rotates with rotary speed $\omega$ in the direction shown. Patterned spokes 211 may be used as part of a reference system for tracking the position of the substrates 201 relative to the rotary stage coordinate system with optical sensors that sense a pattern on the spokes 211. By way of example, the spokes 211 may be visible to both the tool 210 and a separate substrate metrology system.

Figure 2G:
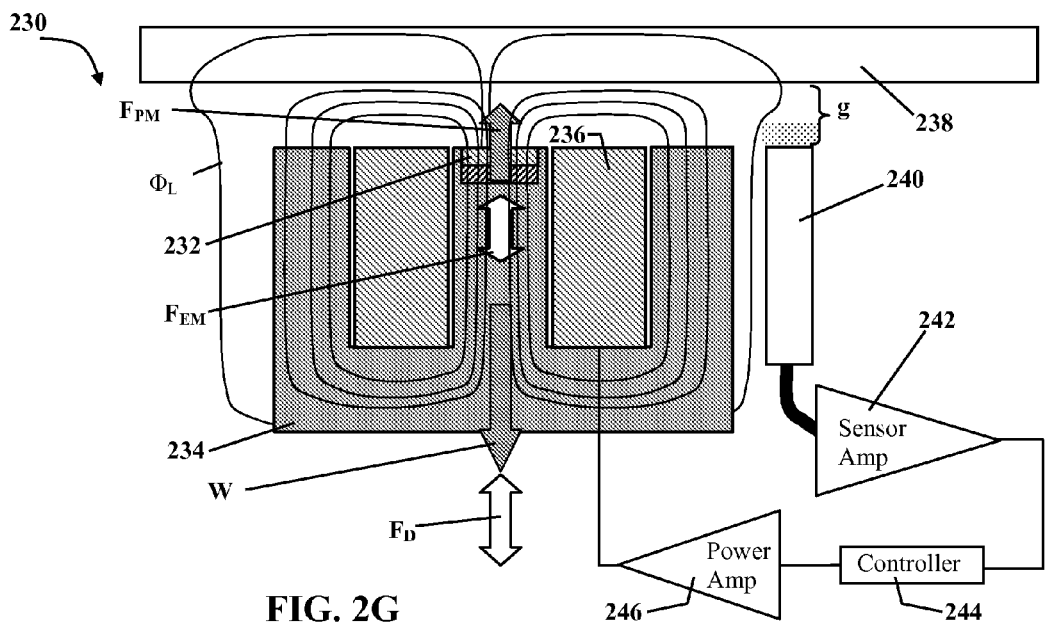
FIG. 2G is a schematic diagram of a maglev unit that may be used as part of the substrate processing apparatus of FIGS. 2A-2E.

Substrates 201, e.g., semiconductor wafers are exposed to radiation from the beam column 210 in a spiral from an outer radius $R_o$ to an inner radius $R_i$. Substrates 201, e.g., semiconductor wafers, are placed on the chucks 203 at radius $R_{wi}$ (i=1, 2 . . . N) and angle $\theta_{wi}$ from the center of the rotary stage, which defines the axis z. In this example, the substrates are rotated by an angle $\phi_{wi}$=45° relative to the substrate placement radius. Each substrate offset and rotation from the stage coordinate system is slightly different and is individually tracked FIG. 2G illustrates an example of a maglev unit 230 that may be used in the apparatus of FIGS. 2A-2F, e.g., as a radial maglev 207X, 207Y, X-stage Y-maglev 216 or Z-maglev 209. The maglev unit 230 includes a permanent magnet 232 an electromagnetic having a magnetically permeable core 234 and a winding coil 236. The core 234 conducts magnetic flux from both the permanent magnet 232 and the electromagnet. In the vertical configuration shown in FIG. 2G, the permanent magnet 232 produces enough flux to fully suspend the weight of the maglev and the attached payload (e.g., a portion of the combined weight of the rotary stage 202, linear stage 204 and motor 220. The coil 236 produces additional flux, which controls a gap g between the maglev 230 and a ferromagnetic guideway 238. In certain embodiments it may be desirable to contain the leakage flux shown on the sides of core, e.g., by a properly designed mu-metal shield and/or by shaping of the ferromagnetic material around the gap.

A gap sensor 240 may be coupled to a sensor amplifier 242 and a controller 244 that regulates current to the coil 236, e.g., by applying a signal to a power amplifier 246. If, for example, dynamic forces tend to move the maglev 230 downwards, e.g., as determined by an increase in the gap g measured by the gap sensor 240, the controller 244 may signal the power amplifier 246 increase current to the coil 236 to add additional flux to the flux due to the permanent magnet 232, thereby increasing the attractive force. If the gap g decreases, as measured by the gap sensor 240, the controller 244 may signal the power amplifier 246 to adjust the current to the coil 236 to produce flux in the direction opposite to that of the permanent magnet 232. The controller 244 may be commanded to maintain a constant gap g, or to exert a prescribed force across the gap to cause deliberate motion of the maglev, as in stage focusing action.

The rotary stage 202 spins about its axis of symmetry z and translates along the x axis. The linear stage 204 maintains the rotary stage 202 on a straight path. A following metrology system may close the loop on the position of the rotary stage 202 and the position of the electron beam relative to the substrates on the chucks 203. Feedback of the stage position may be derived from a number of different sensors. As shown in FIG. 2B, these sensors may include interferometers 250Y, 250Z mounted to the translation stage 204 to sense horizontal and vertical movement of the rotary stage 202 and/or translation stage 204 relative to the chamber lid 208. By way of example, an interferometer 250Y may track y-axis movement of the rotary stage 202 using a Y-reference mirror 254 mounted to the chamber lid 208 and a cylindrical surface of a ring mirror 256 attached to a periphery of the rotary stage 202. The cylindrical (side) surface of the ring mirror 256 is concentric with the rotation axis z. In addition, rotary encoders 252 may sense the rotation of the rotary stage 202. Another interferometer may track z-axis movement of the rotary stage using a reference mirror 258 (seen in FIG. 2C) mounted to the chamber lid 208 and a flat (top) reflecting surface of the ring mirror 256. The top reflecting surface of the ring mirror 256 and the Z-reference mirror 256.

The heavy and rigid chamber lid 208 forms the inertial frame of reference for the stage metrology. A set of interferometer mirrors is kinematically attached to the lid and forms the metrology frame. This configuration reduces the effect of stage forces on the metrology.

Figure 2H:
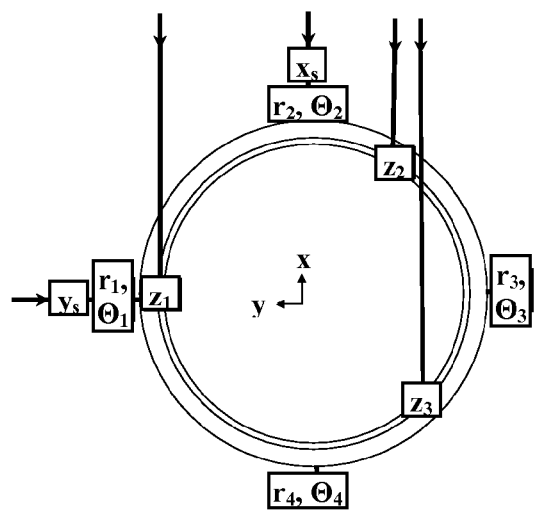
FIG. 2H is a top plan view schematic of the rotary-translating stage showing the positions of radial sensors and rotary encoders.
Figure 2I:
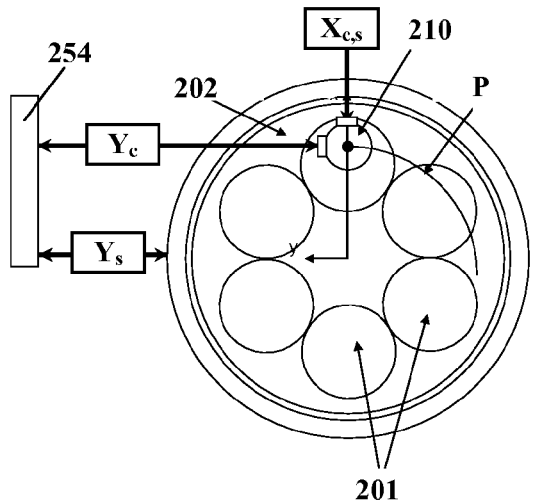
FIG. 2I is a top plan view schematic of a substrate processing apparatus using an optical column in conjunction with a rotary-translating stage according to an embodiment of the present invention.

There are a number of different possible configurations for the interferometers and sensors described above. For example, as shown in FIG. 2H between 1 and 4 radial sensors $r_1, r_2, r_3, r_4$ may measure the radial displacement of the rotary stage 202 relative to the X-stage 204 while 1 to 4 rotary encoders $\Theta_1, \Theta_2, \Theta_3, \Theta_4$, measure the tangential displacement of the rotary stage periphery. Using redundant sensors allows dynamic measurement of both the deviation of the cylindrical surface of the rotary stage 202 from a perfect cylinder, and direct measurement of the motion of the center of the cylinder relative to the X carriage reference frame. It is noted that the radial sensors $r_1, r_2, r_3$ and $r_4$ of FIG. 2H may also be implemented as differential interferometers or as other types of sensors, such as capacitance sensors. The bandwidth of these sensors may be up to about 200 MS/s. Rotary velocity measurements from these sensors may be coupled in a feedback loop with position update from the optical sensors in a reference based on the spokes 210. If the redundancy is excessive, some of the sensors may be dropped.

Differential interferometers x, y, $z_1, z_2, z_3$ track changes in the relative position of the rotary stage 202 with respect to a mechanically stable fixed reference, e.g., the chamber lid 208. The interferometers may be characterized by a bandwidth between about 100 kHz and about 1 MHz. The interferometers are used in a feedback loop with corresponding maglevs to stabilize the rotary axis z in relation to the tool 210 with a mechanical servo bandwidth of about 100 to 300 Hz. Such a system may be characterized by a following error within 100 nm in the x, y, and z directions.

Embodiments of the present invention may use differential interferometers to monitor the relative movement of the rotary stage so that a beam from the tool 210 follows a predetermined path P across the substrates 201 retained by the chucks 203. For example, as shown in FIG. 2H an interferometer $Y_s$ may measure the position of the stage relative to a stationary reference system (e.g., with respect to the chamber lid 208) along the y axis. Another differential interferometer $X_{c,s}$ may measure the position of the cylindrical perimeter of the rotary stage 202 relative to the tool 210, which may be an electron beam column. The $Y_c$ interferometer differentially measures the location of the tool 210 relative to stationary reference mirror 254 along the y axis using a mirror 266 mounted to the beam column. The $X_{c,s}$ interferometer may similarly track variation in the location of the tool 210 with respect to the x axis using a stationary reference mirror mounted to the chamber lid 208 parallel to the y-z plane and a mirror 268 mounted to the tool 210. The YS differential interferometer measures the position of the rotary stage 202 relative to a reference mirror 254. The above-mentioned interferometers may alternatively be implemented in non-differential configurations.

In addition to the above-described interferometers, the following sensors may be used to track the remaining degrees of freedom of the rotary stage: interferometers $z_1, z_2, z_3$ may be kinematically mounted to the chamber lid 208 to measure position of the top or the bottom of the stage relative to a stationary plane mirror in a z-direction perpendicular to the x and y axes. The use of three interferometers allows tracking of the tilt of the cylinder about the x and y axes. Alternatively, using 4 interferometers for z sensing may have advantages over the 3 interferometer configuration. Signals from the interferometers and sensors shown in FIGS. 2G-2H may be fed back to the various maglevs used to position the rotary stage 202 relative to the x-stage 204, the x-stage relative to the guideways 214 and the linear motors 205 that move the x-stage along the guideways 214.

Figure 2J:
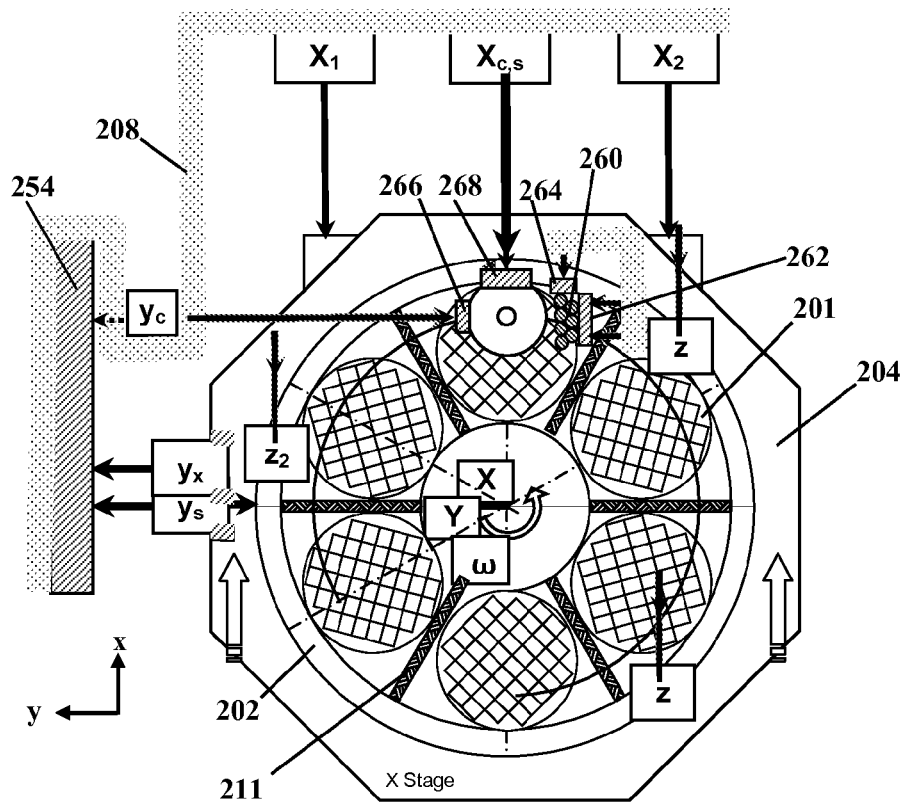
FIG. 2J is a top plan view schematic of a substrate processing apparatus rotary-translating stage according to an embodiment of the present invention showing one possible configuration for servo tracking and metrology.

Several metrology configurations exist for an apparatus of the type described above with respect to FIGS. 2A-2I. By way of example FIG. 2J, illustrates metrology for direct column and Substrate metrology system (SMS) 260 using the chamber lid 208 as a metrology reference frame In this example an optical based SMS 260 covers a die-size wide 30 mm swath upstream of an electron beam (e-beam) from the tool 210. A much narrower (e.g., 200-μm) field of view of the e-beam may be used to capture sparse die alignment marks on the substrates 201 on every pass.

The SMS 260 may include one or more optical sensors 262 adapted to sense reference features located on the substrates 201. Reference mirrors 264 may be used in conjunction with interferometers (not shown) to track the location of the SMS 260 relative to the chamber lid 208. The optical sensors measure the x and y positions of substrate marks with respect to a substrate coordinate system. Such reference marks may be located, e.g., on the spokes 211. The sensors may also measure Z (focus). A process coupled to the SMS 260 interpolates signals from the optical sensors and creates a grid of wafer surface distortion values. The coordinate system for the SMS 260 may be a moving coordinate system, having as its origin a corner of a reference die on the substrate 201. The processor may designate one wafer as a master wafer and calculate the origin shift of the other wafers relative to the master wafer. The processor may also updates the optical sensor position relative to null position of the electron beam using interferometric measurements of the sensor position relative to the chamber lid 208.

If the locations of the tool 210 and SMS 260 are not stable, they may be tracked using differential measurements and reference mirrors. The SMS cluster may be tracked in x and y directions and yaw angle about the z axis as it focuses on a substrate 201. E-beam to column shifts may also be tracked dynamically. The stage to substrate coordinates may be updated several times on every turn of the rotary stage 202, e.g., using the SMS 260 and e-beam tracking.

Differential interferometers $Y_s$, $Y_x$ and $Y_c$, which are referenced to a y-reference mirror 262 attached to the chamber lid 208, track the position of the rotary stage 202, X-stage 204 and e-beam column 210, respectively along the y axis. Differential interferometers $Z_1$, $Z_2$, $Z_3$, which are referenced to a mirror mounted to chamber lid, 208 track vertical position, tip and tilt of the rotary stage 202. Interferometers $X_1$, $X_2$, which are referenced to x-reference mirror 264 attached to the chamber lid 208, track the position of the X-stage 204 along the x axis and yaw of the X-stage 204 about the z axis.

Figure 3A:
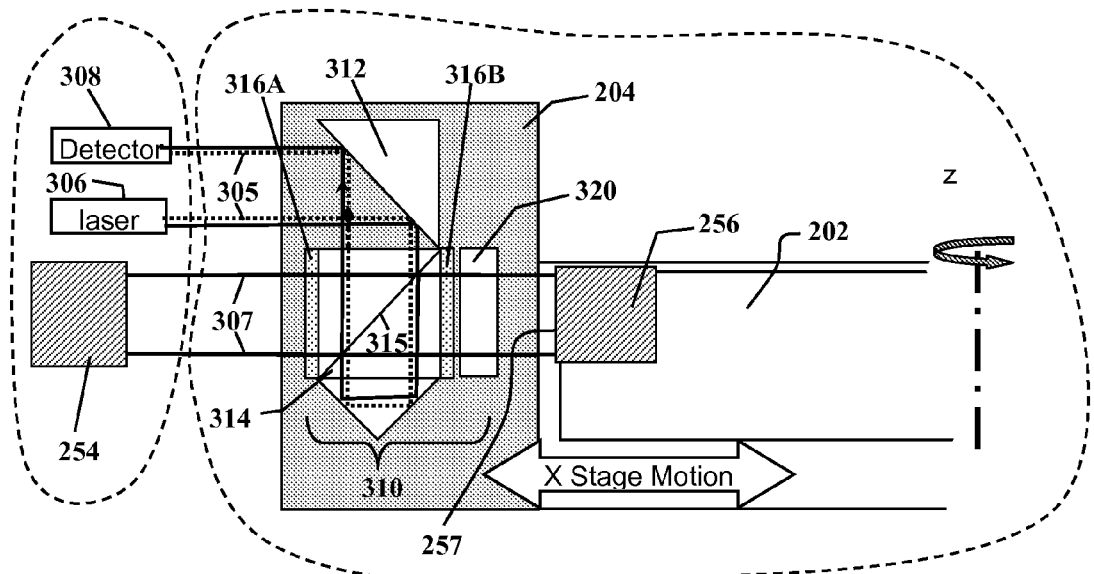
FIG. 3A is a cross-sectional schematic diagram of a portion of a rotary-translating stage showing the use differential interferometers to track horizontal translation of the rotary stage according to an embodiment of the present invention.
Figure 3B:
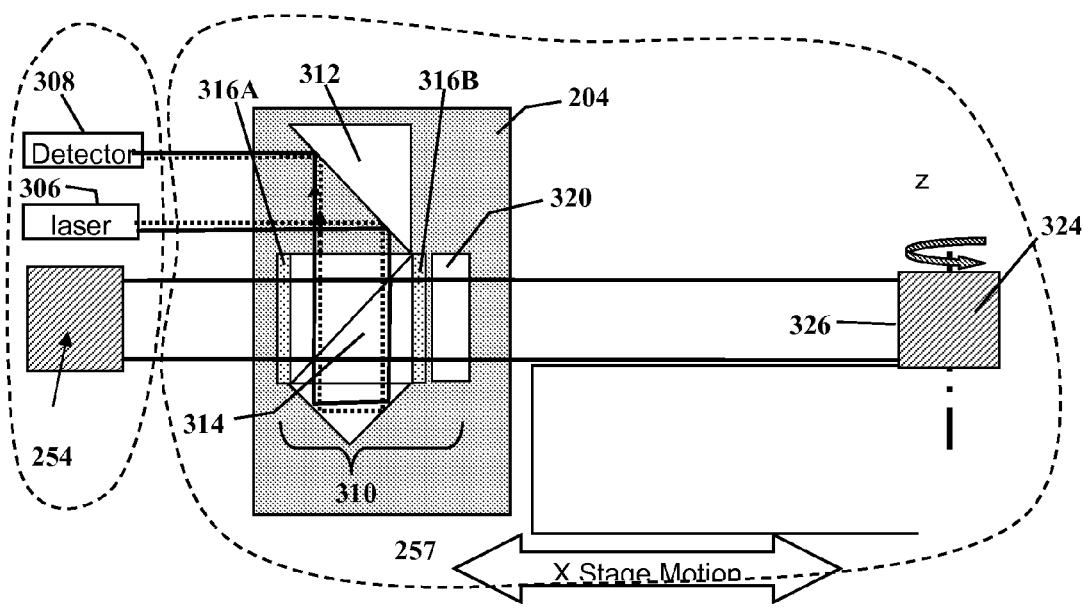
FIG. 3B is a cross-sectional schematic diagram of a portion of a rotary-translating stage showing the use of differential interferometers to track horizontal translation of the rotary stage according to an alternative embodiment of the present invention.

Examples of preferred differential interferometer configurations for use in motion tracking are shown in FIGS. 3A-3E. Specifically, as shown in FIGS. 3A-3B, in a rotary-linear stage of the type shown in FIGS. 2A-2E, optical motion tracking may be implemented with a differential interferometer 310 disposed between a reference mirror 254 and a stage ring mirror 256 having a cylindrical surface 257 that is concentric with the z axis. The interferometer 310 is mounted to the linearly translatable X-stage 204. The reference mirror 254 is mounted in a fixed in position relative to the X-stage 204. By way of example, in preferred embodiments, the reference mirror may be mounted the lid of the chamber 208 that contains the X-stage 204 and rotary stage 202. In the example shown in FIG. 3A, the stage ring mirror 256 is peripherally mounted to the rotary stage 202, which rotates about a rotation axis z that is in a substantially fixed position and orientation with respect to the X-stage 202. The stage ring mirror 256 provides a cylindrical reflecting surface that is symmetric about the rotation axis z. The interferometer 310 includes a folding mirror 312, a polarization beamsplitter 314 disposed between first and second quarter waveplates 316A, 316B a corner cube mirror 318 and wavefront compensation optics 320. Interferometers having this design are described in detail in International Patent Application Publication WO 2005/078526 A1, published 25 Aug. 2005 and entitled "A SYSTEM FOR POSITIONING A PRODUCT".

Light from a source, such as a laser 306 is deflected by the folding mirror 312 towards the polarization beamsplitter 314. The light from the source 306 contains first and second polarizations. Light having the first polarization of the light passes through the beamsplitter and is reflected by the corner cube 318 back through the polarization beamsplitter to the folding mirror 312, which deflects the light to a detector 308. This light serves as a reference beam 305 indicated by the dashed optical path.

Light having the second polarization is reflected at a diagonal interface 315 of the polarization beamsplitter 314 through the first quarter waveplate 316A, off the reference mirror 254 and back through the first quarter waveplate 316A. The two trips through the first quarter waveplate 316A convert the light from the second polarization to the first polarization. As a result, the light can pass through the interface 315, the second quarter waveplate 316B and the wavefront compensation optics 320 to the curved surface of a cylindrical stage ring mirror 256 having an axis concentric with the z axis. After reflection by the stage ring mirror 256 the light passes back through the wavefront compensation optics 320 and the second quarter waveplate 316B. The two trips through the second quarter waveplate convert the light from the first polarization back to the second polarization. As a result, the light is deflected by the interface 315 towards the corner cube 318, which bends the light back to the folding mirror 312. The folding mirror 312 deflects the light to the detector 308. Light following this path serves as a measurement beam 307 indicated by the solid optical path. Light from the reference path 305 and measurement beam 307 interfere at the detector producing a signal that depends on relative changes in the lengths of the two beam paths due to motion of the rotary stage 202 with respect to the reference mirror 254.

In an alternative embodiment depicted in FIG. 3B, a small cylindrical mirror 324 having a cylindrical surface 326 concentric with the z axis may be used in place of the peripheral ring mirror 256. In either configuration, the wavefront compensation optics 320 are configured so that wavefronts traveling from the interferometer 310 and the cylindrical reflecting surface 257, 326 are compensated for reflection from the cylindrical mirror 256, 324 so that light reflected from the cylindrical reflecting surface 257, 326 follows the proper path back through the interferometer 310. By way of example, the wavefront compensation optics 320 may include cylindrical optical components or spherical optical components.

Figure 3C:
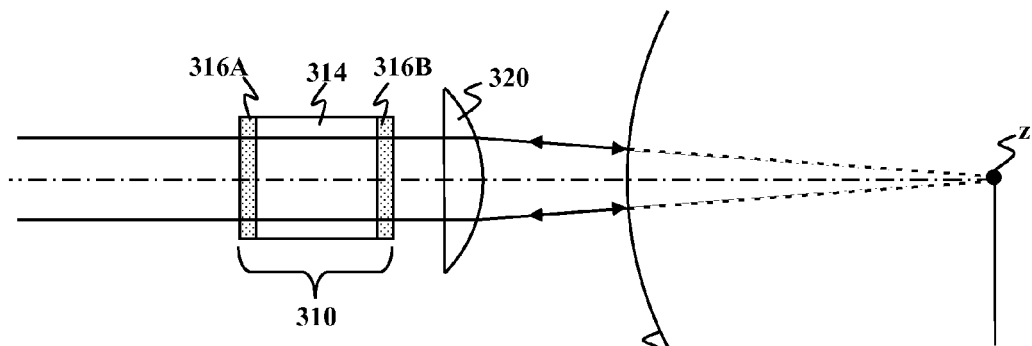
FIG. 3C is a top plan view of a portion of a differential interferometer being used with a rotary-translating stage according to an embodiment of the present invention illustrating a possible configuration of wavefront compensation optics.
Figure 3D:
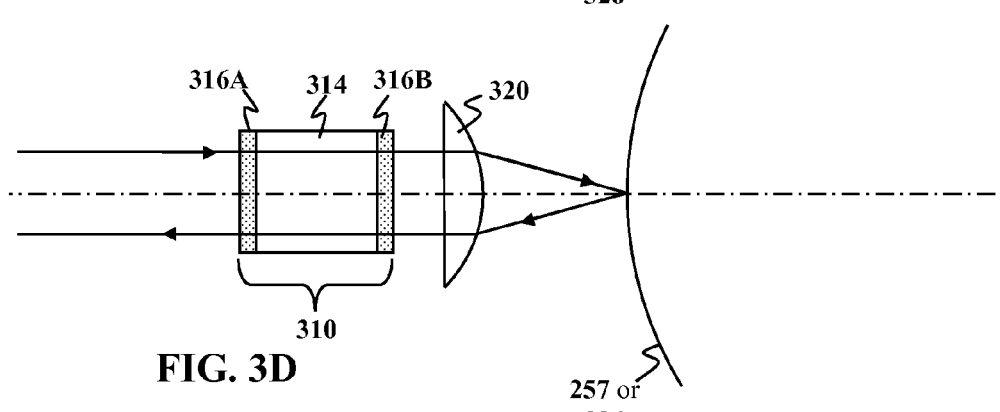
FIG. 3D is a top plan view of a portion of a differential interferometer being used with a rotary-translating stage according to an embodiment of the present invention an alternative configuration of wavefront compensation optics.

A number of different configurations for the wavefront compensation optics 320 may be used to couple light between the interferometer 310 and cylindrical reflecting surface 257 or 326. By way of example and without limitation, two possible configurations of the wavefront compensation optics are shown in FIG. 3C and FIG. 3D. In FIG. 3C, the wavefront compensation optics 320 focuses parallel light from the interferometer 310 at the axis of curvature of the wavefront compensation optics, e.g., on the rotation axis z. In this way, light reflected from the cylindrical surface 257, 326 of mirror 256, 324 follows essentially the same path as the light incident on the cylindrical mirror from the interferometer 310. In an alternative configuration depicted in FIG. 3D, the wavefront compensation optics is configured to focus parallel light from the interferometer 310 onto the surface 257 or 326 of the cylindrical mirror 256 or 324. In this way, light beams incident on and reflected from the cylindrical mirror 256, 324 follow parallel paths through the interferometer 310.

It is noted that tracking the rotary stage motion using reflection from the curved reflecting surface 257 or 326 using the wavefront compensation optics 320 as described above is suitable for measuring small amplitude vibrations relative to the X-stage 204 or the lid 208. As used herein small amplitude refers to motions that are no larger than the depth of focus of the wavefront compensation optics 320.

The differential interferometer 310 is carried by the motion of the X-stage 301, so that the interferometer 310 is always pointed at the center of rotation of the rotary stage 303 and remains in alignment with the rotary stage 303. Although a stage ring mirror 256 at the periphery of the rotary stage is shown in FIG. 3A, alternatively, a small cylindrical hub 324 at the center of the rotary stage 303 may provide a cylindrical reflecting surface, e.g., as shown in FIG. 3B. It is noted that in both FIG. 3A and FIG. 3B, the reference mirror 254, laser 306 and detector 308 remain fixed with respect to the X-stage 204 and rotary stage 202 as indicated by the dashed line surrounding these components. Preferably, these components are mounted to a lid of a chamber that contains the X-stage 204, rotary stage 202 and interferometer 310, which move in the x-direction, as indicated by the dashed line surrounding these components.

The interferometer 310 is carried by the X stage 204, and is aligned to the center of the X Stage 204. A servo system based on this interferometer system maintains the prescribed linear motion of the X stage 204 and the rotary stage 202 moving together, and following each other as closely as possible. The rotary stage axis z remains fixed relative to the X stage 204. Therefore, the alignment does not change as a result of this motion.

The interferometer 310 moves with the X stage towards the laser 306 and detector 308, however, to first order, this motion does not affect the reading of the detector 308. The detector 308 only senses an optical path difference between the cylindrical mirror 256 and the stationary reference mirror 254.

Figure 3E:
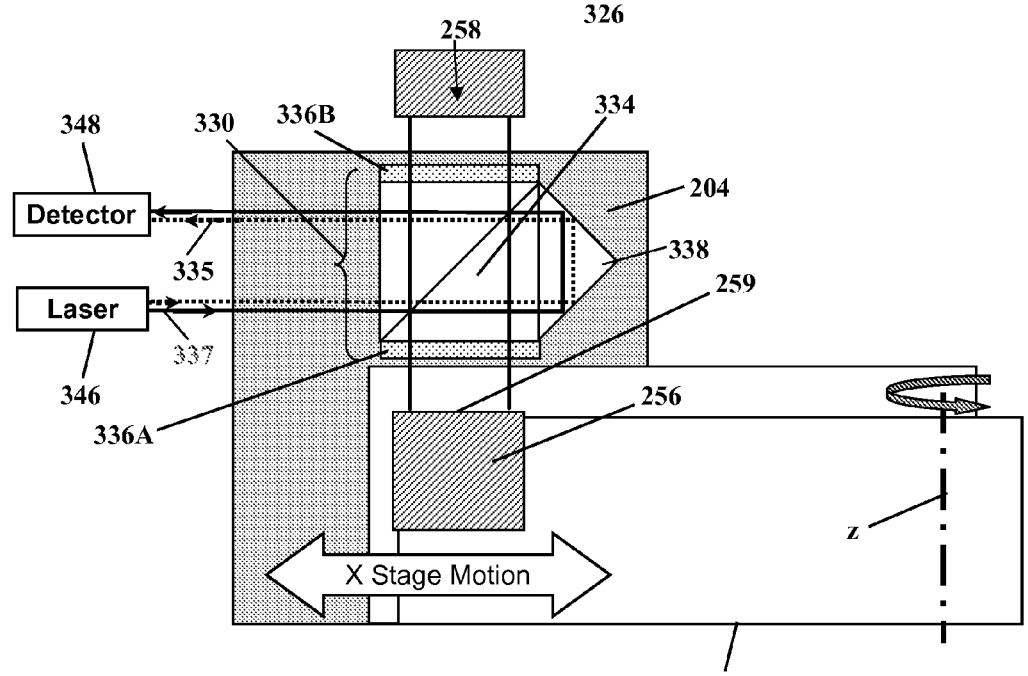
FIG. 3E is a cross-sectional schematic diagram of a portion of a rotary-translating stage using differential interferometers to track vertical movement of the rotary stage according to an embodiment of the present invention.

As shown in FIG. 3E, the Z interferometers may also be configured differentially. Once again, an interferometer 330 is attached to the X-stage 204 along an optical path between a stationary reference mirror 258 and the stage ring mirror 256. The reference mirror 258 may be mounted to the lid of the chamber 208, e.g., as shown in FIGS. 2C-2D. The interferometer includes a polarization beamsplitter 334, quaffer waveplates 336A, 336B, and corner cube 338. Light from a laser 346 is divided into a reference path 335 and a measurement path 337 through the interferometer 330 to a detector 348. Operation of the interferometer 330 is similar to operation of the interferometer 310 described above with respect to FIG. 3A. Since the measurement beam 337 reflects from a flat upper surface 259 of the stage ring mirror 256 wavefront compensation optics between the interferometer 330 and the stage ring mirror 256 are not necessary.

Some of the design concepts described above with respect to rotary-linear stages may be advantageously applied to more conventional X-Y stages. For example, it is noted that one of the advantages of the apparatus 200 described above is that the various maglevs and magnetic motors are located near the edges of the rotary stage and X-stage. This places the magnetic fields generated by these devices at a considerable distance with respect to the tool 210. Such a configuration can be particularly advantageous if the tool is sensitive to stray magnetic fields. For example, where the tool 210 includes an electron beam column stray magnetic fields from the maglevs may deflect the electron beam, resulting in an error in its position. Although the deflection of the beam may be tracked and compensated, it is more desirable to avoid, or at least significantly reduce, such magnetic deflection. The placement of the maglevs at the edges of the rotary stage 202 and X-stage 204 and away from the optical column 210 may significantly reduce errors associated with stray magnetic fields from the maglevs. The rotary stage 202 may be made of a magnetically transparent material, e.g., a ceramic, so that magnetic fields from a magnetic lens of the tool 210 are not distorted.

Figure 4A:
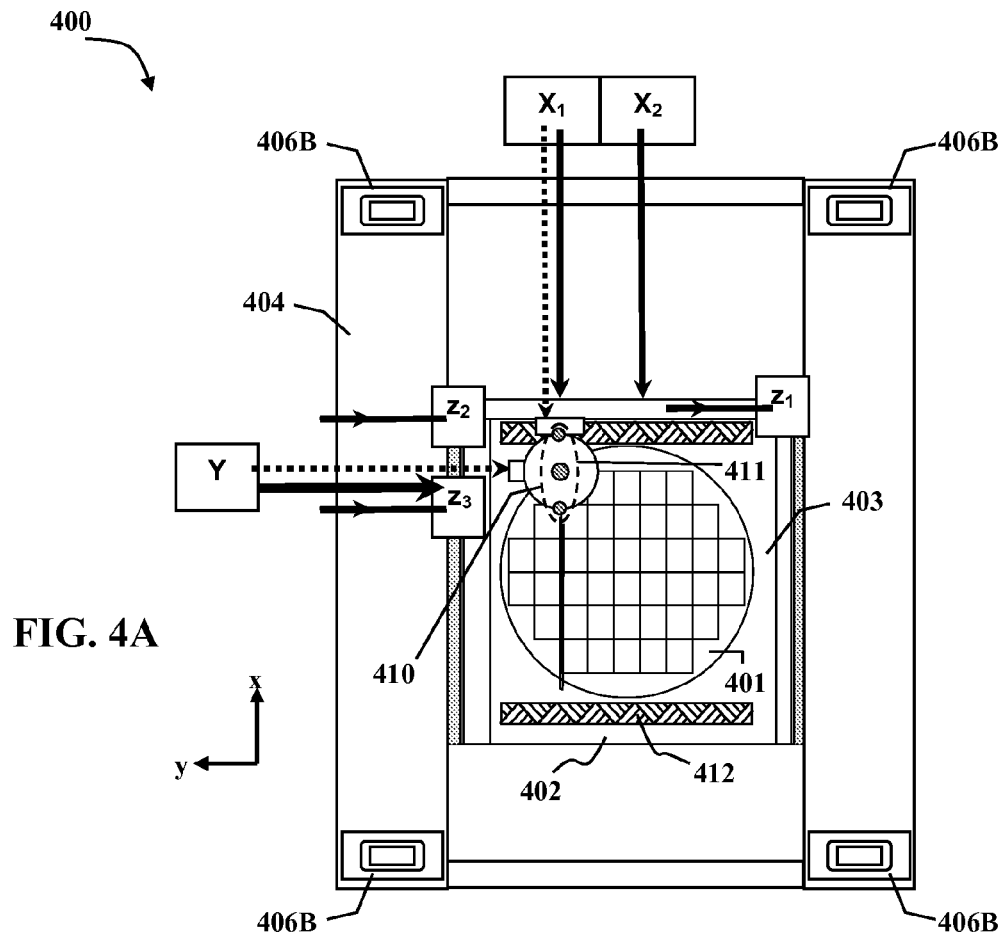
FIG. 4A is a top plan view schematic diagram of an X-Y translating stage according to an embodiment of the present invention.
Figure 4B:
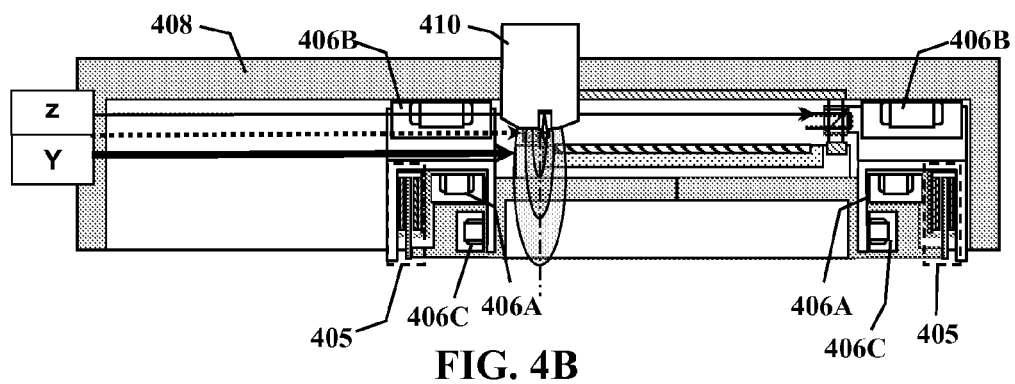
FIG. 4B is a cross sectional schematic diagram of the X-Y translating stage of FIG. 4A.

This same concept of supporting the stages with edge-mounted maglevs may be applied to an X-Y stage according to an embodiment of the present invention. For example, FIGS. 4A-4B depict a substrate processing apparatus 400 according to an alternative embodiment of the present invention. The apparatus 400 includes an X-stage 402 and a Y-stage 404. The X-stage 402 includes a chuck 403 adapted to retain a substrate 401. The X-stage 402 is suspended from the Y-stage 404 by vertical maglevs 406A mounted at the corners of the X-stage 402. Controlled movement of the X-stage 402 along an X-axis relative to the Y-stage 404 may be imparted, e.g., by linear motors 405. The Y-stage 404 is suspended from a chamber lid 408 by vertical maglevs 406B mounted at corners of the Y-stage 404. The Y-stage 404 may be adapted to move in a Y direction relative to the chamber lid 408, e.g., using linear motors (not shown). The position of the X-stage 402 relative to the Y-stage 404 along the Y axis may be regulated using edge-mounted horizontal maglevs 406C coupled in feedback loops with appropriate sensors. The X-stage 402 may move in the X and Y directions relative to a substrate processing tool 410, which may include, e.g., an electron beam column. By placing the linear motors 405, vertical maglevs 406A, 406B and horizontal maglevs 406C away from the substrate 401, undesired magnetic deflection of the electron beam from the column 410 may be avoided. The X-stage 402 may be made of a magnetically transparent material, e.g., a ceramic, so that magnetic fields from a magnetic lens of the tool 410 are not distorted.

Metrology for directing the tool 410 and a substrate metrology system (SMS) 411 may use the chamber lid 408 as a metrology reference frame. The SMS 410 may be tracked in the x and y directions and yaw about the z axis as it focuses on the substrate 401. The SMS 411 may use reference pattern 412 similar to those seen on the spokes 211 in FIG. 2F and FIG. 2J. By way of example, the SMS 411 may cover a swath approximately as wide as a (e.g., about 30 mm) upstream of the e-beam column 410 and a much narrower field of view (e.g., about 200 μm) to capture sparse die alignment marks on every pass. Since the stage 402 reverses direction, the SMS 411 may include two optical sensors. One sensor may be located on either side of column 410 arranged in an X-scanning direction. If the column and SMS locations are not differential measurements, reference mirrors may be used to determine these positions. In addition, shifts in the e-beam position relative to the tool 410 may be tracked dynamically to precisely position the electron beam from the column 410 on the substrate 401. Stage to substrate coordinates may be updated on turnarounds of the X-stage 402 on a calibration chip, using SMS and e-beam location information.

The apparatus 400 may use one or more interferometers to track the position of various components with respect to the chamber lid 408. These may include an interferometer $X_1$ that measures movement along the x axis of the X-Stage 402 relative to the tool 410 and chamber lid 408. A second interferometer $X_2$ measures movement of the X-stage 402 relative to the chamber lid 408, thereby facilitating measurement of yaw of the X-stage 402. A third interferometer Y measures movement along the y axis of the X-Stage 402 relative to the chamber lid and the tool 410. Vertical differential interferometers Z1, Z2, Z3, may be configured, e.g., as shown in FIG. 3E to measure changes in position of the top of the X-stage 402 relative to the chamber lid 408. X Stage top to lid, differential. Although additional interferometers may be used to track the motion of the carriage in the Y-stage 404, this may alternatively be accomplished with the maglevs and/or linear motors used to support and/or move the Y-stage 404 along the y direction. Although in this example, the x and y axes are perpendicular to one another, they may alternatively be oriented at some oblique angle.

Figure 5:
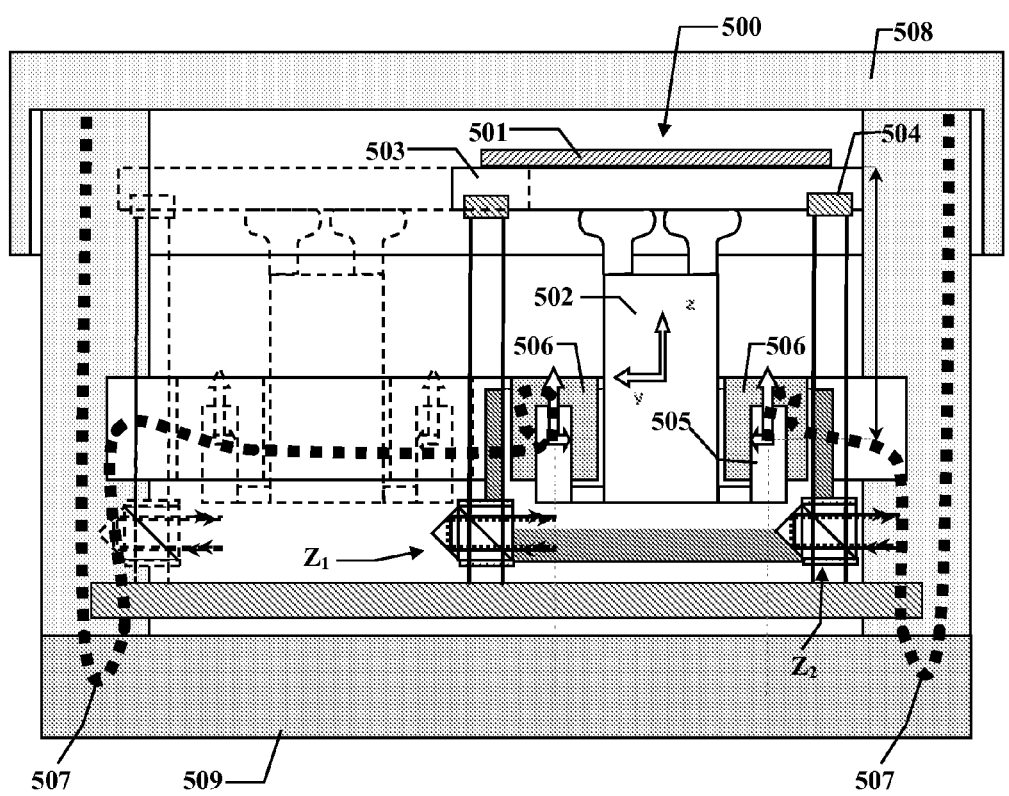
FIG. 5 is a side view elevation schematic of an X-Y translating stage of the prior art.

The advantage of the configuration shown in FIGS. 4A-4B may be illustrated by comparison with a prior art X-Y stage 500, e.g., as depicted in FIG. 5. In the prior art X-Y stage 500 an X-stage 502 is levitated by maglev units 506. Mounts 504 attached to the X-stage 502 support a chuck 503 that retains a substrate 501. The X-stage and Y-stage are adapted to move along x and y axes respectively, e.g., using linear motors 505. An example of such a prior art X-Y stage is described in detail, e.g., in International Patent Application Publication WO 2005/078526 A1, published 25 Aug. 2005 and entitled "A SYSTEM FOR POSITIONING A PRODUCT".

Downward looking differential interferometers $Z_1$, $Z_2$, track variations of the vertical z position of the X-stage 502 relative to a base 509 of a chamber 508. A mirror 512 is positioned on the underside of the X-stage 502 for this purpose. It is noted that in this design, the maglev units 506 are directly beneath the substrate. This is done to keep the maglev system from interfering with the downward-looking interferometers $Z_1$, $Z_2$. Stray magnetic fields from the maglev units 506 can deflect the path of an electron beam. Furthermore, the configuration of the maglevs 506 requires a relatively tall central support 504 and correspondingly long mechanical paths 507 for reaction forces from the maglevs 506 to the chamber lid 508, which is used as a reference mass. For example, the moment arm between the top of the X-stage 502 and the point of application of horizontal forces by the maglevs 506 may be as much as 200 mm. This configuration also requires a relatively large chamber to support the X-Y stage 500. In embodiments of the present invention, by contrast, the upward-looking interferometers use the chamber lid as a reference. This allows the maglev units to be placed at or near the edges of the X-stage or rotary stage. Consequently the mechanical path for reaction forces can be made much shorter, the apparatus made more stable and the chamber may be smaller.

Embodiments of the invention allow for more compact and stable rotary-translation stages and X-Y stages. Embodiments relating to rotary stages provide for high substrate throughput with lower linear acceleration that would be required for an X-Y stage, with short path lengths for reaction forces, stable configuration of the bearings and compact design. Embodiments of the invention relating to X-Y stages provide for shorter path lengths for reaction forces, greater stability and more compact design than in prior art X-Y stages.

Figure 6A:
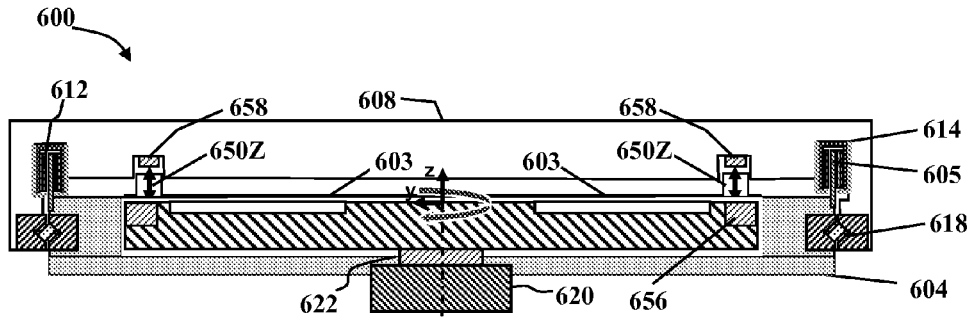
FIG. 6A is a y-z cross-sectional view of the substrate processing apparatus according to an alternative embodiment of the invention.
Figure 6B:
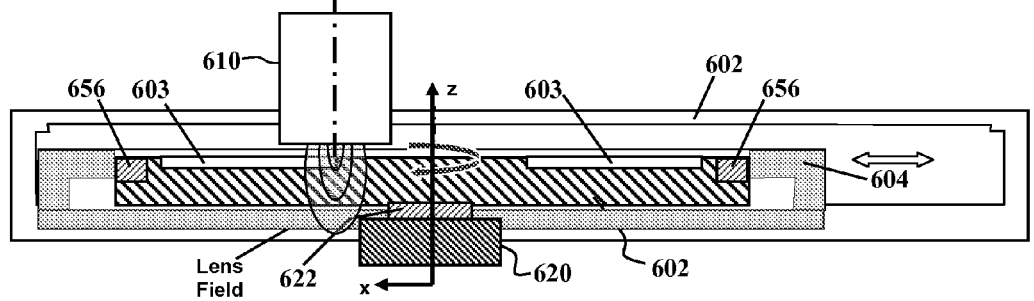
FIG. 6B is an x-z cross-sectional view of the apparatus of FIG. 6A.

It is noted that some embodiments of the present invention may utilize something other than magnetic levitation, e.g., mechanical bearings or air bearings, to provide bearings for the X-stage and rotary stage and/or Y-stage. For example, FIGS. 6A-6B depict an alternative substrate processing apparatus 600 according to an alternative embodiment.

The apparatus 600 includes a rotary stage 602 and translation stage 604 disposed in a chamber 608. The rotary stage 602 carries a plurality of substrate chucks, which may be configured as described above. The rotary stage 602 may be spun by a central rotary motor 620 mounted to the linear stage 604. The motor 620 includes a spindle bearing 622 attached to the center of the rotary stage 602. The rotary stage 602 spins about a z axis and the X-stage 604 moves the rotary stage along an x axis. A substrate processing tool 610 remains more or less fixed with respect to the chamber lid 608 as described above. Note that the placement of the chucks 603 shown in FIGS. 6A-6B keeps substrates mounted to the chucks at a distance from stray magnetic fields from the motor 620. Linear motors 605 mounted at edges of the X-stage 604 move the linear stage 604 along parallel ferromagnetic guideways 614 mounted to the chamber 608. The linear motors 605 may include a set of lateral electromagnets 612 of alternating polarity. In this example, bearings 618 between the X-stage 604 and chamber 608 may keep the motion of the X-stage 604 aligned with the x axis. By way of example, the bearings 618 may be mechanical cross-bearings. Mechanical bearings may be used if stage positioning noise from the bearings does not exceed the ability of the metrology systems to track motion of the substrates mounted to the chucks 603. In alternative embodiments, the bearings 618 may be air bearings. It is noted that if the bearings are in vacuum, differential pumping may be used for air bearings. It is further noted that the motor 620 may include an air bearing.

Positioning of the rotary stage 602 and X-stage 604 may be monitored as described above, e.g., using interferometers 650Z and peripherally mounted ring mirror 656 on the rotary stage 602 and reference mirrors 658 mounted to the chamber lid 608.

In embodiments of the present invention it is often desirable for a rotary-linear stage to control a position of the substrates relative to the tool to within 10 nanometers of a desired position. There are a number of different ways to accomplish this. For example, as described above, the position of the substrates and the tool may be very tightly controlled with respect to a reference frame, such as the chamber lid. Generally, it is desirable to have very high resolution (e.g., less than 1 nm) in sensing the stage position and in positioning the beam from the tool with respect to the substrates. Embodiments of the invention may use precise control of the rotary-linear stage in conjunction with precise control of a position of the beam from the tool to achieve the desired resolution in beam positioning. For example, in the case of an electron beam tool, beam positioning may be adjusted through the use of electrostatic and/or electromagnetic lenses in conjunction with electrostatic and/or electromagnetic beam deflection mechanisms (e.g., raster plates or deflection coils). If the range of focus and/or X-Y beam deflection is both sufficiently large and sufficiently accurate it may be possible to tolerate a somewhat greater degree of variation in the position of the substrates relative to the optical column. For example, if the positioning accuracy of the beam deflection and focusing is less than about 1 nm and the range of beam positioning is about 1 micron, the system can tolerate stage position variations of roughly 1 micron, provided the metrology system can track these variations and the beam deflection mechanism can respond quickly enough.

In the particular example of an electron beam tool, there are a number of different ways of controlling stage and/or beam position in order to achieve the desired positioning accuracy for the optical column. Control of the beam and/or stage position may be understood with respect to the block diagram shown in FIG. 7. By way of example, control of a rotary-linear stage of the types described above may be implemented using three sets of inner multiple input multiple output (MIMO) control loops: a) the stage loops, b) the lid and optical sensor loops and c) optical column-beam position and focus control loops. An overall outer control loop may estimate the relative position between the optical column and the substrate using a spoke-reference system (SRS) and substrate metrology system (SMS) as described above. Servo mechanisms may be used to bring this error to zero using a slower stage loop and a faster beam loop.

Figure 7:
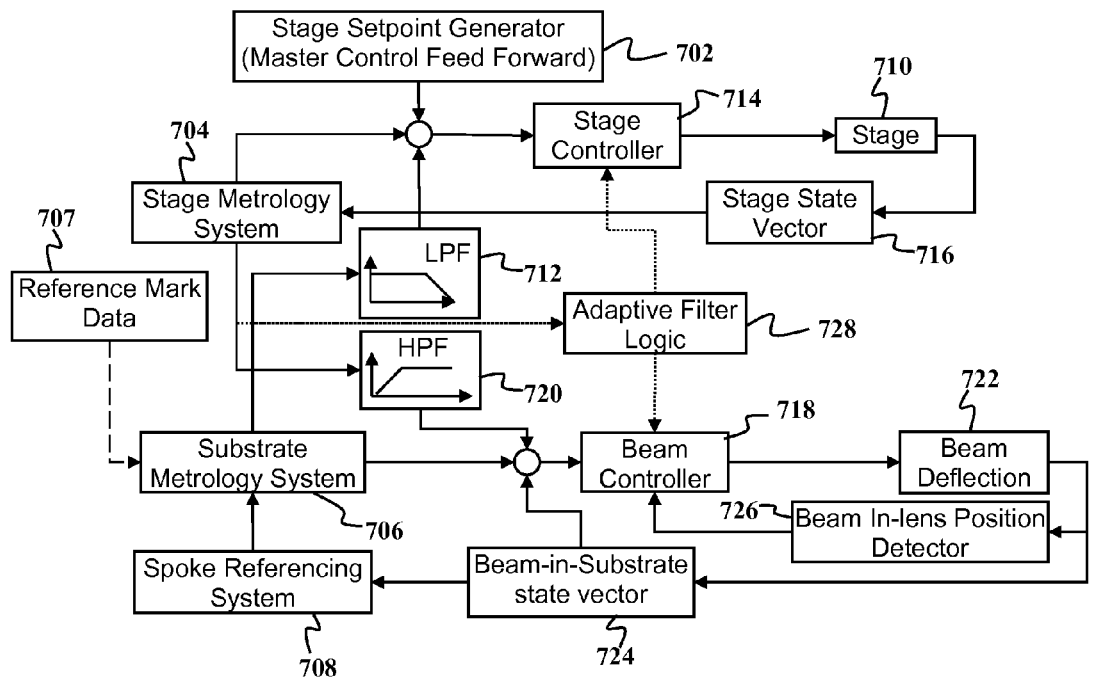
FIG. 7 is a block diagram illustrating stage control and metrology in a substrate processing method according to an embodiment of the present invention.

In FIG. 7 a stage Setpoint Generator 702 generates nominal trajectories in x and θ that are used to perform probing of the substrates with the optical column. In addition this stage setpoint generator 702 may be used to position the stage for loading, to perform substrate alignment, map the substrate distortions prior to writing, and create a focus map for the optical column and the SMS. In some embodiments, data regarding known topographic features of the substrates may be stored in a database, which may include information regarding the relative orientation of the substrates and their thickness variations. These may be measured as a part of a spin up process and used to generate a correction table to compensate for any misalignments.

The stage setpoint generator 702 may also utilize calibration data that captures thermal and elastic deformation of the rotary stage and/or substrates. For example, the temperature of various components in the system and the resulting distortion due to CTE differences may be monitored. The distortion values may be pre-computed and stored as a part of the calibration data in the setpoint generator 702. The stage setpoint generator 702 may also include corrections for measured non-uniformities in a given rotary stage. Furthermore, models of the distortion of the rotary stage due to centrifugal forces during spin-up may be stored as a part of calibration data in the setpoint generator 702.

A stage metrology system 704 may perform the r, θ measurements of the rotary stage in addition to the x, y and z interferometer measurements, as described above. The stage metrology system 704 may include multiple redundant sensors and one of the functions represented in this block may include a set of sensor fusion algorithms that provide estimates of the various coordinates of the stage position. The stage metrology system 704 may also contain calibration tables for each of the sensors to compensate for errors that are systematic. For example, harmonic errors in the θ measurements may be measured during a calibration process and stored. These known errors may then be removed from actual measurements before generating estimates of the position of the rotary stage. Similar calibration data is generated and used for the other sensors that are a part of the stage metrology system 704.

An optional Substrate Metrology System (SMS) 706 may provide a measurement between the optical sensors held by the lid and the substrate. If the optical sensors are referenced to the column, the SMS 706 may provide an estimate of the position of a substrate relative to the beam from the optical column. The SMS 706 may optionally utilize reference marks 707 on the substrates to obtain input, e.g., regarding the relative orientation and thickness variations of the substrates.

The SMS 706 may receive input from a spoke reference system (SRS) 708 that uses spokes of the type described above. The SRS 708 may allow a sensor, e.g., an optical sensor, in the SMS 706 to provide a measurement of the relative position between spokes on the stage and the substrates. The spokes may be features on the rotary stage such as those shown in FIGS. 2F and 2J. Initial positions of the spokes relative to the substrate position may be stored as a part of the calibration data after loading the substrates.

Measurements obtained from the Stage Metrology system 704, SMS 706, and SRS 708 may be used to control the position of the rotary-linear stage 710 using MIMO control referenced to the chamber lid for minimal length, force and metrology paths. By way of example, the electron beam may be "visible" to the spokes in the spoke reference system 708. For example, the spokes may be electrically conducting and configured so that it is possible to determine where the beam strikes a particular spoke. This information may be used to by the SMS 706. For example, the WMS 706 may also use the information from the spoke reference system 708 to produce an adjusted substrate position signal, which may be filtered by the low pass filter 712. The output of the low pass filter 712 may then be combined with inputs from the stage setpoint generator 702 and stage metrology system 704 to produce an error signal that is fed to a stage controller 714. By way of example, the stage controller 714 may be a MIMO controller that issues a simultaneous command to all actuators that control the positioning of the rotary stage and linear stage in the stage 710. In the case of the system 200 of FIGS. 2A-2J, the controller 714 may adjust the actuation of rotary-stage positioning maglevs, the x-translation and θ-rotation actuators to drive the error signal to zero.

The command to this stage control loop may have two components. The first component is the reference trajectory command from the stage setpoint generator 702. The second component is a low-pass filtered beam to substrate position error estimate from the low pass filter 712. The stage controller 714 may be used to stabilize the rotary stage and reject imbalance, precession and nutation motion of the rotary stage. In addition, the stage controller 714 may make corrective actions to rectify the low frequency portion of the beam to substrate position error. These corrections may be fed back to the stage metrology system 704 in the form of a stage state vector 716. By way of example, the Stage Metrology System 704 may measure displacements at the interferometer points of incidence, e.g., as described above. Knowing the laser beam configuration relative to the point of reference on the stage, the stage vector 716 may be calculated. The stage state vector 716 may contain displacements, velocities, accelerations and possibly jerks (derivatives of accelerations with respect to time), in all stage degrees of freedom: e.g., XYZ, pitch, roll, and yaw.

Measurements from the Stage Metrology system 704 SMS 706 and SRS 708 may also be used to estimate a Beam to substrate position error. The beam position error may be used to drive a beam controller 718 in such a way as to drive the beam to substrate position error to zero. The beam controller 718 may operate on an error between the commanded beam position and the actual measured beam position and aims to minimize the error. The beam controller 718 receives an input from the stage metrology system 704 that is filtered with a high-pass filter 720. The beam controller 718 also receives an input from the substrate metrology system 706. The combination of these inputs provides a high pass filtered value of a beam-substrate position error estimate.

By way of example the beam controller 718 may produce signals that control a beam deflection mechanism 722 and the actual beam dynamics. The beam deflection mechanism 722 may include electrostatic deflectors or electromagnetic deflectors. The beam deflection control signals may be used to derive a beam-in-substrate state vector 724, which may be combined with measurements of the beam position from the spoke referencing system 708 to produce a measured beamin-substrate state vector. The measured beam-in-substrate state vector may be used as an input to the beam controller 718.

The beam controller 718 may also obtain input from a Beam In-Lens Position detector 726 that senses the position of the beam relative to the optical column. The beam-in-lens position detector 726 may sense a position of an optical or electron beam from the optical column relative to an optical axis. The beam-in-lens position detector may also receive input from the beam deflection mechanism 722. In some embodiments, the beam-in-lens position detector 726 may also include a focus sensing scheme.

It may be seen from the preceding discussion that the stage controller 714 and stage 710 provide correction for a low-frequency component of the beam-substrate position error and the beam controller 718 and beam deflection 720 provide correction for a high-frequency component of the beam-substrate position error. The stage controller 714 and beam controller 718 may receive additional input from adaptive Filter Logic 728 which may be implemented in hardware or in software, e.g., in the form of adaptive control algorithms. By way of example, the adaptive filter logic 728 may use Kalman filtering. The adaptive filter logic 728 may receive input from the Stage Metrology System 704. There are a number of different possible implementations of the adaptive filter logic 728. For example an imbalance between actuators used to translate the rotary stage in the x direction may cause a variation in the angular speed of the rotary stage. The sensors used in the stage metrology system 704 may sense this imbalance and a differential command may be applied by the stage controller to the x actuators to compensate for the imbalance between the two actuators. Alternatively, reaction forces from controlling the rotary stage may cause motion in the chamber lid. These reaction forces may be adaptively cancelled, e.g., using electrodynamic actuators. In addition, the adaptive filter logic 728 may adaptively correct for effects of thermal and elastic deformation of the rotary stage and/or substrates based on measurements from the substrate metrology system 706 and the spoke referencing system 708 during operation.

It is noted that if the rotation of the rotary stage is relatively slow and/or the substrates are not subject to significant deformation due to heat loads and/or high acceleration, embodiments of the invention may be able to achieve resolution of 10 nm or better in tool-substrate positioning without the substrate metrology system 706.

While the above is a complete description of the preferred embodiment of the present invention, it is possible to use various alternatives, modifications and equivalents. Therefore, the scope of the present invention should be determined not with reference to the above description but should, instead, be determined with reference to the appended claims, along with their full scope of equivalents. Any feature, whether preferred or not, may be combined with any other feature, whether preferred or not. In the claims that follow, the indefinite article "A" or "An" refers to a quantity of one or more of the item following the article, except where expressly stated otherwise. The appended claims are not to be interpreted as including means-plus-function limitations, unless such a limitation is explicitly recited in a given claim using the phrase "means for."

What is claimed is:

1. A substrate processing apparatus, comprising:
a support structure; and
a moveable stage having a first stage and a second stage, wherein the first stage is adapted to retain one or more substrates, wherein the first stage is adapted to move with respect to a first axis having a substantially fixed position and orientation with respect to the second stage, and wherein the second stage is adapted to translate with respect to the support structure along a second axis, the moveable stage also having one or more magnetic levitation (maglev) units attached to the first stage and/or second stage proximate an edge of the first stage, and wherein the first and/or second translation stage is made of a magnetically transparent material.

2. The apparatus of claim 1, wherein the first stage is a rotating stage and the second stage is a linear translation stage, wherein the rotary stage is adapted to retain one or more substrates, wherein the rotary stage is adapted to rotate about a rotation axis having a substantially fixed position and orientation with respect to the linear translation stage, and wherein the linear translation stage is adapted to translate with respect to the support structure along a translation axis, the moveable stage also having one or more magnetic levitation (maglev) units attached to the rotary stage and/or translation stage proximate an edge of the rotary stage.

3. The apparatus of claim 2, wherein the maglev units include one or more rotary stage maglev units mounted to the linear translation stage, the apparatus further comprising a ferromagnetic ring concentric with the rotation axis attached at a periphery of the rotating stage, wherein the maglev units are configured to apply forces to the ferromagnetic ring.

4. The apparatus of claim 3 wherein the rotary stage maglev units include one or more rotary stage vertical maglev units adapted to apply vertical forces to the ferromagnetic ring.

5. The apparatus of claim 4, wherein the maglev units include one or more translation stage vertical maglev units adapted to suspend the translation stage from the support structure.

6. The apparatus of claim 5, wherein the support structure is a lid of a chamber that contains the moveable stage.

7. The apparatus of claim 5 wherein the translation stage vertical maglev units are arranged in a close proximity configuration with corresponding rotary stage vertical maglev.

8. The apparatus of claim 3 wherein the magnetic levitation units include one or more rotary stage radial maglev units attached to the translation stage, wherein the rotary stage radial maglev units are adapted to apply forces to the ferromagnetic ring in a radial direction.

9. The apparatus of claim 8 wherein the radial maglev units include one or more Y radial maglev units adapted to apply forces to the ferromagnetic ring in a Y direction that is orthogonal to both the rotation axis and the translation axis.

10. The apparatus of claim 9 further comprising one or more translation stage Y maglev units adapted to apply forces to the translation stage in the Y direction.

11. The apparatus of claim 10 wherein the translation stage Y maglev units are arranged in a close proximity configuration with corresponding rotary stage Y maglev units.

12. The apparatus of claim 2 further comprising one or more interferometers adapted to sense changes in position of the rotary stage and/or linear stage and/or a substrate processing tool with respect to a metrology reference frame.

13. The apparatus of claim 12 wherein the metrology reference frame is fixed with respect a lid of a chamber that contains the moveable stage.

14. The apparatus of claim 13 wherein one or more interferometers include one or more differential interferometers.

15. The apparatus of claim 13 wherein the one or more interferometers include an interferometer disposed along one or more optical paths between a light source and an optical sensor, the one or more optical paths including a reference beam path and a measurement beam path, wherein the measurement beam path includes a portion between a first reference mirror mounted to the chamber lid and a second reference mirror mounted to the rotary stage, the translation stage or an substrate processing tool that is in a substantially fixed position with respect to the support structure.

16. The apparatus of claim 15 wherein the first reference mirror is a Y reference mirror oriented parallel to the translation axis and the rotation axis.

17. The apparatus of claim 15 wherein the one or more interferometers include an interferometer mounted to the translation stage and wherein the second reference mirror is a cylindrical mirror attached to the rotary stage, wherein the cylindrical mirror has a cylindrical reflecting surface substantially concentric to the rotation axis.

18. The apparatus of claim 17 wherein the cylindrical reflecting surface is located at a periphery of the rotating stage.

19. The apparatus of claim 17 wherein the cylindrical reflecting surface has a radius that is less than a radius of the rotating stage.

20. The apparatus of claim 17 wherein the interferometer mounted to the translation stage includes a wavefront compensation optic disposed between a beam splitter and the cylindrical mirror, the wavefront compensation optic being configured to compensate for reflection of light from the measurement beam at the cylindrical reflecting surface.

21. The apparatus of claim 20 wherein the wavefront compensation optic is adapted to focus parallel light from the beamsplitter at the rotation axis.

22. The apparatus of claim 20 wherein the wavefront compensation optic is adapted to focus parallel light from the beamsplitter at the cylindrical reflecting surface.

23. The apparatus of claim 15 wherein the first reference mirror is a Z reference mirror oriented perpendicular to the rotation axis.

24. The apparatus of claim 23 wherein the one or more interferometers include an interferometer mounted to the translation stage and wherein the second reference mirror is attached to or part of the rotary stage, wherein the second reference mirror includes a reflecting surface substantially perpendicular to the rotation axis.

25. The apparatus of claim 2, further comprising a substrate processing tool adapted to process one or more substrates supported by the rotating stage, wherein an optical column of the substrate processing tool is in a substantially fixed position with respect to the support structure.

26. The apparatus of claim 25 wherein the substrate processing tool includes an electron beam optical column.

27. The apparatus of claim 2, further comprising a central rotor attached to the rotary stage and a stator attached to the linear stage, wherein the rotor and stator are adapted to impart rotary motion to the rotary stage about the rotation axis, wherein the rotor and stator are configured to support a weight of the rotary stage.

28. The apparatus of claim 27, wherein the rotor and stator are configured such that magnetic forces exerted by the stator on the rotor are sufficient to support all or most of the weight of the rotary stage.

29. The apparatus of claim 1 wherein the first stage is a first translation stage and the second stage is a second translation stage, wherein the first translation stage is adapted to retain one or more substrates, wherein the first translation stage is adapted to move linearly with respect to a first axis having a substantially fixed position and orientation with respect to the second translation stage, and wherein the second translation stage is adapted to translate with respect to the support structure along a second axis that is oblique with respect to the first axis, wherein the one or more magnetic levitation (maglev) units attached to the first and/or second translation stage proximate an edge of the first translation stage, wherein the maglev units are adapted to exert magnetic forces between the first and second translating stages.

30. The apparatus of claim 29 wherein the support structure is a lid of a chamber that contains the X-Y stage.

31. The apparatus of claim 29 wherein the maglev units include one or more maglev units configured to apply forces between the first and second translation stages along a direction parallel to the second axis.

32. The apparatus of claim 29 wherein the maglev units include one or more vertical maglev units adapted to apply force between the first and second translation stages in a direction perpendicular to the first and second axes.

33. The apparatus of claim 29, wherein the maglev units include one or more vertical maglev units adapted to suspend the second translation stage from the support structure by applying force between the support structure and the second translation stage in a direction perpendicular to the first and second axes.

34. The apparatus of claim 33, wherein the support structure is a lid of a chamber that contains the moveable stage.

35. The apparatus of claim 29 further comprising one or more interferometers adapted to sense changes in position of the first translation stage and/or second translation stage and/or an optical column that is substantially fixed with respect to the support structure and adapted to direct radiation to one or more substrates supported by the first translation stage, with respect to a metrology reference frame.

36. The apparatus of claim 35 wherein the metrology reference frame is fixed with respect a lid of a chamber that contains the moveable stage.

37. The apparatus of claim 35 wherein one or more interferometers include one or more differential interferometers.

38. The apparatus of claim 35 wherein the one or more interferometers include an interferometer disposed along one or more optical paths between a light source and an optical sensor, the one or more optical paths including a reference beam path and a measurement beam path, wherein the measurement beam path includes a portion between a first reference mirror mounted to a chamber lid and a second reference mirror mounted to the rotary stage, the translation stage or a substrate processing tool.

39. The apparatus of claim 38 wherein the first reference mirror is a Z reference mirror oriented substantially parallel to the first and second axes.

40. The apparatus of claim 39 wherein the one or more interferometers include an interferometer mounted to the second translation stage and wherein the second reference mirror is attached to the first translation stage, wherein the second reference mirror includes a reflecting surface substantially perpendicular to the first and second axes.

41. The apparatus of claim 29, further comprising a substrate processing tool adapted to process one or more substrates supported by the first translation stage, wherein an optical column of the substrate processing tool is in a substantially fixed position with respect to the support structure.

42. The apparatus of claim 41 wherein the substrate processing tool includes an electron beam optical column.

43. A substrate processing apparatus, comprising:
a support structure;
a rotary-linear stage having a rotating stage and a linear translation stage, wherein the rotary stage is adapted to retain a plurality of substrates, wherein the rotary stage is adapted to rotate in a continuous motion about a rotation axis having a substantially fixed position and orientation with respect to the linear translation stage, and wherein the linear translation stage is adapted to translate with respect to the support structure along a translation axis;

a lithography, inspection or metrology tool in a substantially fixed position with respect to the support structure; and a control system adapted to control a position of the substrates relative to the tool to within 10 nanometers of a desired position.

44. The apparatus of claim 43, wherein the lithography, inspection or metrology tool includes an electron beam optical column.

45. The apparatus of claim 44, wherein the control system includes one or more sensors adapted to sense a position of the rotary stage, one or more of the substrates and/or the electron beam, wherein the control system includes one or more actuators adapted to adjust a position of the rotary stage relative to the support structure, wherein the electron beam optical column includes a beam deflection mechanism, wherein the control system includes stage controller coupled to the one or more actuators and a beam controller coupled to the beam deflection mechanism
wherein the stage controller is adapted to correct for a low-frequency component of a beam-substrate position error and the beam deflection mechanism is adapted to correct for a high-frequency component of the beam-substrate position error.

46. The apparatus of claim 43, further comprising a central rotor attached to the rotary stage and a stator attached to the linear stage, wherein the rotor and stator are adapted to impart rotary motion to the rotary stage about the rotation axis, wherein the rotor and stator are configured to support a weight of the rotary stage.

47. The apparatus of claim 46, wherein the rotor and stator are configured such that magnetic forces exerted by the stator on the rotor are sufficient to support all or most of the weight of the rotary stage.

48. A substrate processing method, comprising:
retaining a plurality of substrates on a rotary stage,
rotating the rotary stage in a continuous motion about a rotation axis having a substantially fixed position and orientation with respect to a linear translation stage;
translating the linear translation stage with respect to a support structure along a translation axis;
processing the substrates with a lithography, inspection or metrology tool that is in a substantially fixed position with respect to the support structure; and
controlling a position of the substrates relative to the tool to within 10 nanometers of a desired position.

49. The method of claim 48 wherein controlling the position of the substrate relative to the tool includes supporting a weight of the rotary stage using a central rotor attached to the rotary stage and a stator attached to the linear stage.

50. The method of claim 49 wherein supporting the weight of the rotary stage includes using magnetic forces between the rotor and the stator to support all or most of the weight of the rotary stage.

* * * * *